United States Patent [19]

Quintin et al.

[11] 4,294,009

[45] Oct. 13, 1981

[54] METHOD OF MANUFACTURING A HYBRID INTEGRATED CIRCUIT

[75] Inventors: Renee Quintin, Houdan; Claude M. Villemant, Paris, both of France

[73] Assignee: Le Material Telephonique, Boulogne-Billancourt, France

[21] Appl. No.: 52,932

[22] Filed: Jun. 28, 1979

[30] Foreign Application Priority Data

Jun. 29, 1978 [FR] France .................. 78 19509

[51] Int. Cl.³ .......................................... H05K 3/32
[52] U.S. Cl. .................................. 29/832; 29/846; 174/68.5; 427/96; 427/259
[58] Field of Search .............. 29/840, 846, 832; 174/68.5; 427/259, 96, 98, 99

[56] References Cited

U.S. PATENT DOCUMENTS

| | | | |
|---|---|---|---|
| 2,939,807 | 6/1960 | Needham | 427/259 X |
| 3,617,373 | 11/1971 | Mott | 427/259 X |

FOREIGN PATENT DOCUMENTS

| | | | |
|---|---|---|---|
| 49-33824 | 9/1974 | Japan | 174/68.5 |
| 939394 | 3/1969 | United Kingdom | |

*Primary Examiner*—Nicholas P. Godici
*Assistant Examiner*—C. J. Arbes
*Attorney, Agent, or Firm*—Roland Plottel

[57] ABSTRACT

A hybrid integrated circuit having a partially enamelled steel support.

The process starts with an unprocessed steel plate 20 which is first treated to allow bonding of a coat of enamel. Before selected areas are masked by a layer 21, for example of an organic material. After an enamel composition 22 is deposited on all areas of the plate, this deposit is then removed from the masking layer 21. The enamel is then baked at high temperature and the masking is burnt and volatilized. The selected, bared areas of the plate are metallized. They are used as areas for soldering or gluing semiconductor chips 24.

8 Claims, 12 Drawing Figures

METHOD OF MANUFACTURING A HYBRID INTEGRATED CIRCUIT

The present invention relates generally to a process for manufacturing an electrical circuit on a metallic support and more particularly to the production of a hybrid integrated circuit with a metallic support that enables semi-conductors to be connected to ground and permits the heat dissipated by these components to be dissipated.

A hybrid integrated circuit generally has on an appropriate support several passive components, such as resistors and capacitors deposited as thin or thick films, and several active components, such as diodes, transistors, or even monolithic integrated circuits. The components are interconnected by an interconnection network consisting of conducting layers.

The support, sometimes known as a substrate, of the circuit is most often a ceramic plate made of an alumina or beryllium oxide, which are rare and expensive substances. The thermal conductivity of such materials is low compared with that of metals, but they have the advantage of withstanding the high temperatures required for baking the so-called "thick" films.

Silk-screening is a good method for applying these films at low cost, and there are several types of commercially available pastes making it possible to consider promising new applications.

But because of their high cost, fragility, machining difficulty and relatively low thermal conductivity, ceramics are not suitable for producing large-area circuits, such as printed circuits on supports made of laminated or composite material.

Furthermore, composites and laminated materials have the major disadvantage of not withstanding temperatures as high as those withstood by ceramics, so they do not permit the application and high-temperature baking of certain paste compositions used for producing "thick" conducting, dielectric or resistive films.

An object of the present invention is to overcome the above disadvantages, and the production of a hybrid integrated circuit on a support made of material having the following characteristics: (1) thermal conductivity considerably greater than that of an alumina or beryllium oxide-based ceramic; (2) insensitivity to the high temperatures used when baking certain pastes applied by silk-screening; (3) cost per unit of area lower than that of currently used ceramics; (4) greater ease in machining than ceramics, and above all susceptibility to soldering, bending, pressing and die-cutting; and (5) electrical conductivity and capablity of being metallized by an electro-chemical process.

All characteristics offer indisputable advantages compared with ceramic supports. They result in the possibility of obtaining hybrid integrated circuits of higher performance, of a larger area and greater application versatility, and with lower overall cost.

The purposes and features of the present invention will appear more clearly from the following description of practical examples, with the following description and reference to the appended drawings in which.

The various stages of the manufacturing process are described below with the aid of FIGS. 1 to 12 like elements bear like legends.

A plate 20 of decarburized mild steel, of rectangular shape in this example, having a thickness of approximately 0.8 mm, is the circuit support or substrate. This plate 20 is cleaned in a conventional manner to remove all grease, oxide and dirt. If a rough surface is required, the plate is then given a chemical treatment using, for example, sulphuric acid.

Figure 1:
FIG. 1 is a sectional view of a plate of steel in its initial state.
Figure 2:
FIG. 2 is a sectional view of the plate after preparatory surface treatment.

The purpose of this preparatory surface treatment (FIG. 2) is to permit easier bonding of a subsequently applied layer of hot-vitrified enamel.

This preparatory treatment may further include a metallic plating, performed chemically or electrolytically in nickel salt solutions to produce a thin and uniform film of nickel on the surface of the plate.

Figure 3:
FIG. 3 is a sectional view of the plate partially masked.

The next step (FIG. 3) is to mask certain areas selected on one or both sides of the plate. These areas are used later for attaching certain electronic components, such as monolithic integrated circuits in the form of chips.

This masking is performed by applying locally on each selected area a coat 21 or masking film, of organic material. This coat or film should have the property of completely decomposing or volatilizing at a temperature lower than that required for baking the enamel composition which is to be applied at the next stage.

The masking layer may consist of a plastic-based material or a mixture of materials that decompose or volatile at high temperature. Such materials are photopolymerizable resins and cellulosic varnishes.

It is also possible to use adhesive paper masking cut to the dimensions of the selected areas, or peeling varnish in place of the materials mentioned above.

Other means for masking the selected areas include applying metallic masks, preferably magnetic, to the steel plate.

Figure 4:
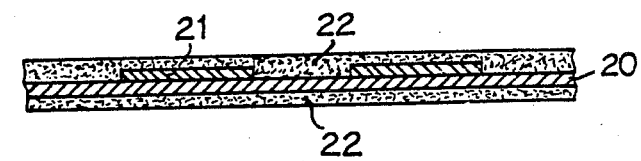
FIG. 4 is a sectional view of the plate after an enamel composition has been deposited on it.

When the required areas have been masked, the unmasked or naked areas of the plate, as well as the top surface of the masking layers, are covered with a coat 22 of enamel composition that can be vitrified on steel (FIG. 4).

This composition should preferably be a liquid paste or a dust, so that one of the following application techniques can be used: painting, dipping, spraying, evaporation, electrophoresis, floating, or silk-screening.

Among the various known compositions of enamel applicable to steel, the one selected will have excellent mechanical resistance after baking, and the surface state of the enamel vitrified at a temperature of approximately 650° C. will be excellent, so that, subsequent so-called "thick" films can be baked onto the enamel layer. In addition, the enamel must possess the dielectrical characteristics required by the circuit.

The following table shows typical enamel compositions that can be applied in this case and it is possible to mix the two types if necessary.

|  | Enamel Type I | Enamel Type II |
| --- | --- | --- |
| $SiO_2$ | 40 to 50 | 30 to 40 |
| $B_2O_3$ | 20 to 25 | 20 to 25 |
| Alkaline fluxes | 20 to 25 | 15 to 20 |
| Titanium | — | 20 |
| Alumina | 3 to 4 | 1 |
| Bonding oxides | 15 to 20 | — |
| Fluorite | 4 | 4 |
| Baking temperature | 780° C. | 840° C. |
| Cubic expansion $\times 10^{-7}$ between 20° C. and 100° C. | 280 to 300 | 245 to 255 |

Figure 5:
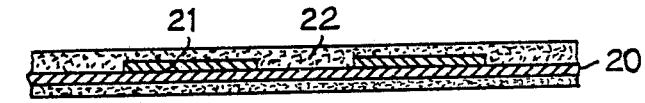
FIG. 5 is a sectional view of the plate after the enamel deposit has been dried.

The plates are then stoved (FIG. 5) to drive out any water or other solvents in the enamel composition. This stoving should be performed at a temperature that leaves the masking layers or masks intact.

Figure 6:
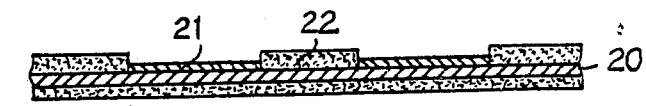
FIG. 6 is a sectional view of the plate after partial removal of the enamel deposit.

Before baking, the layer of dried enamel over the mask 21 (FIG. 6) is detached and removed by a technique appropriate to the nature of the layer, such as mechanical shock or vibration, blowing, suction or peeling.

The enamel coating deposited and dried on the roughened plate remains bonded, while the coating deposited on the mask can be separated and removed. The smoother the masking surface in contact with the deposited dried enamel, the easier this operation.

If metallic masks are used instead of organic masking, they are removed before baking the enamel.

Figure 7:
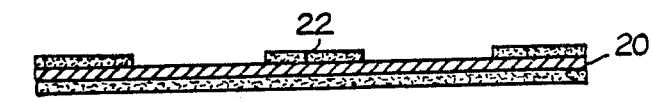
FIG. 7 is a sectional view of the plate after the enamel deposit has been baked.

After cleaning the masking, or removing the masks, the enamel is baked (FIG. 7). The thermal treatment used should correspond to the composition of the enamel. It is preferable to use a baking temperature range of 780° C. to 840° C., which is the temperature range generally required for baking enamels currently used for enamelling sheet steel. The composition of such enamels is indicated in the above table.

Following this thermal treatment, the enamel is permanently bonded to the steel in the form of a continuous dielectric layer. At the same time, if masking with organic material is used, the latter is burnt and volatilized. In this manner, the previously masked metallic areas are again bared.

Figure 8:
FIG. 8 is a sectional view of the plate after metallic coating of the steel.

The next step (FIG. 8) is preparing and then coating these bare areas with one or more electrically conducting metallic films 23 with the last film being easily solderable. It is preferable to deposit a film of gold, silver or tin-lead on a film of nickel or copper. These films are applied by means of any known or convenient depositing techiques, such as chemical or electrolytic plating, the silk-screening of pastes, evaporation or sputtering of metals through masks.

Figure 9:
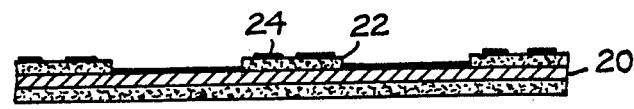
FIG. 9 is a sectional view of the enamelled plate covered with an interconnection network and resistive and dielectric films.

The baked enamel layer is then ready to take the network 24 of a hybrid integrated circuit (FIG. 9). This network is produced by the so-called "thick" film silk-screening technique by which conducting inks or pastes are applied to the enamel coating and then baked at a temperature appropriate for the composition of the pastes or inks used. This silk-screening technique is cheap and for this reason commonly used for producing conducting, dielectric, and resistive films on ceramic substrates.

If, electrical characteristics which cannot be produced by silk-screening are required, other well-known depositing techniques, such as evaporation or sputtering of metals through masks are used.

Figure 10:
FIG. 10 is a sectional view of the previously illustrated enamelled plate on which semiconductor chips are attached to the metallic surfaces.
Figure 11:
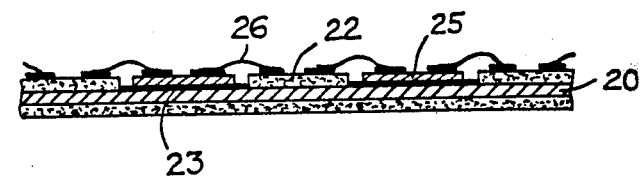
FIG. 11 is a sectional view of a hybrid integrated circuit after the chips have been connected.

Monolithic integrated circuits 25 in the form of chips can then be attached (FIG. 10) to the bare areas of the plate that have previously been treated for soldering. Depending on the nature of the surface, which may be metallic, semiconducting or both, an appropriate fixing technique must be used. The appropriate technique would be alloying, braising, or soldering with or without the addition of a pure metal or eutectic alloy placed between the chip and the solderable film.

It is also possible to use the technique of attaching the chips with conducting glues.

It is seen that the contacts established in this matter between the chips and the steel support are extremely conducive to excellent cooling of the chips, because of the excellent thermal conductivity of the steel (much higher than that of ceramics) and because of the very slight thickness of the layers between the chips and the steel support.

The metallic areas of the plate can obviously be used for soldering other electronic components, whether active or passive, instead of the semiconductor chips.

Connections between the network and the semiconductor chips and other electronic components are made in accordance with conventional methods: the welding of microleads 26 or any other technique, e.g. microrods or microstrips.

Figure 12:
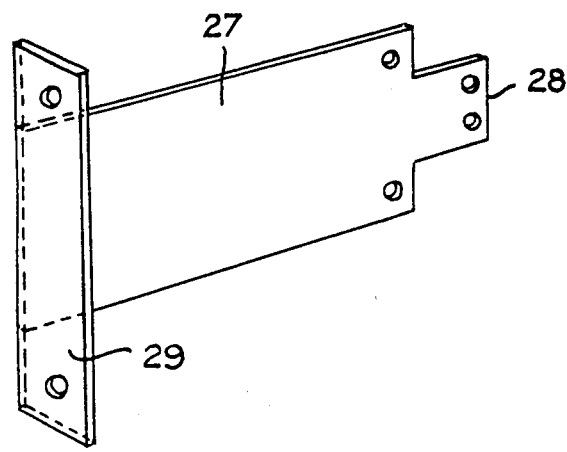
FIG. 12 represents one possible shape of a support for a hybrid integrated circuit manufactured by the process described by the invention.

FIG. 12 shows an alternative shape of a support 27 for a hybrid integrated circuit in accordance with the invention. Instead of a completely flat plate 20, the plate 27 has been cut before the operations described above, to produce a part 28 narrower at one end and a part folded at right-angles at the other end to form a flat flange 29. After being enamelled, the end 28 is used as a support for the conducting terminal of the interconnection network and can be fitted with a plug or socket or designed to be plugged directly into a socket. The flat flange 29 can be punched, for example, for screwing to a chassis. This flange can also be fitted with components for controlling the hybrid integrated circuit.

In order to minimize thermal resistance of the contact between the flange 29 and the chassis, the mating surface of flange 29 is not coated with enamel. In this manner, the metallic body of the substrate can also be used as a ground plane as well as a heat sink.

Similarly, it is possible to install on end 28 of the substrate a connector, of which one contact plane can be used for electrical connections and the other plane as a thermal "connection" and a ground connection.

If it is required to increase the cooling surface of such a circuit, part of the plate should be left free of electronic components.

Although the principles of the present invention are described above in terms of practical examples, it should be clearly understood that the description is given as an example only and does not limit the scope of the present invention.

What we claim is:

1. A method of manufacturing a hybrid integrated circuit having on a substrate passive components, such as resistors and capacitors deposited in the form of thin or thick films, and active components, such as diodes, transistors and monolithic integrated circuits, connected together by means of an interconnection network, comprising the steps of:
   (a) selecting a steel plate of a size corresponding to the circuit to be manufactured;
   (b) preparing the surfaces of the steel plate to receive a coat of enamel which can be bonded to and vitrified on steel;
   (c) masking selected areas of the plate by the local application of a coat of thermally decomposable or volatilizable material;
   (d) coating the surfaces of the plate and mask with an even layer of an enamel composition which can be vitrified on steel;
   (e) drying the enamel coating while leaving the masking intact;
   (f) removing the dried enamel deposited over the masking;
   (g) thermally treating the plate in order to bond the dried enamel coating on the steel, and for volatilizing or burning the masking material on the masked areas, thus forming a dielectric enamel layer, and baring of the masked areas;
   (h) forming on selected portions of the bared areas of the plate a solderable and electrically conducting metallic film;
   (i) forming passive components and an interconnection network on the continuous layer of dielectric enamel using techniques of depositing inks or pastes followed by baking;
   (j) fixing monolithic integrated circuits to the previously metallized areas of the plate, and;
   (k) electrically connecting the monolithic circuits to the interconnection network by means of metallic conductors.

2. A method of manufacturing a hybrid integrated circuit having on a substrate passive components, deposited in the form of thin or thick films, and active components, connected together by means of an interconnection network, comprising the steps of:
   (a) selecting a steel plate of a size corresponding to the circuit to be manufactured;
   (b) preparing the surfaces of the steel plate to receive a coat of enamel which can be bonded to and vitrified on the steel;
   (c) masking selected areas of the plate by the local application of a mask;
   (d) coating the surfaces of the plate and mask with a layer of an enamel composition which can be vitrified on steel;
   (e) drying the enamel coating while leaving the masking intact;
   (f) removing the dried enamel deposited over the masking;
   (g) removing the mask and simultaneously or subsequently thermally treating the plate in order to bond the dried enamel coating on the steel, thus there being formed a dielectric enamel layer over part of the steel and said steel being bare where there was the mask areas;
   (h) forming on selected portions of the bare areas of the plate, at least one solderable and electrically conducting metallic film;
   (i) forming the passive components and the interconnection network on the continuous layer of dielectric enamel by depositing inks or pastes followed by baking;
   (j) fixing active components to the previously metallized areas of the plate, and;
   (k) electrically connecting the active components to the interconnection network by means of metallic conductors.

3. A method according to claim 2 wherein said mask is a coat of organic material which is thermally decomposed or volatized during the thermal treating as recited in step g.

4. A method in accordance with claim 2, wherein said masking of the selected areas of the plate, step c, comprises applying a metallic or paper mask, which is removed as recited in step g, before the thermal treatment, as recited in step g.

5. A method in accordance with claim 2, wherein said masking of the selected areas of the plate, step c, comprises applying peelable varnish which is removed as recited in step g before thermally treating the enamel as recited in step g.

6. A method in accordance with claim 2, 3, 4, or 5 comprising a step of preshaping and punching the steel plate before preparing the surface.

7. A method in accordance with claim 2, 3, 4, or 5 wherein part of the steel plate is not covered with enamel in order to provide electrical and thermal contact.

8. A method in accordance with claim 6 including as recited in step d extending the enamel to one end of the steel plate and further steps of depositing conductors by silk screening on said one end of the steel plate and forming a connecting plug or socket electrically connected to said conductors.

* * * * *